(12) United States Patent
Loy et al.

(10) Patent No.: US 11,844,292 B2
(45) Date of Patent: Dec. 12, 2023

(54) MEMORY DEVICES HAVING AN ELECTRODE WITH TAPERED SIDES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 373 days.

(21) Appl. No.: 17/357,905

(22) Filed: Jun. 24, 2021

(65) Prior Publication Data
US 2022/0416158 A1    Dec. 29, 2022

(51) Int. Cl.
*H10N 70/00* (2023.01)
*H10B 63/00* (2023.01)

(52) U.S. Cl.
CPC .......... *H10N 70/828* (2023.02); *H10B 63/80* (2023.02); *H10N 70/011* (2023.02); *H10N 70/823* (2023.02); *H10N 70/841* (2023.02)

(58) Field of Classification Search
CPC .............................. H10N 70/00; H10B 63/00
See application file for complete search history.

(56) References Cited

PUBLICATIONS

Yi-Jen Huang et al., Low-power resistive random access memory by confining the formation of conducting filaments, AIP Advances, 2016, pp. 065022-1-065022-6, vol. 6, AIP Publishing.
Han-Hyeong Choi et al., Tip-enhanced electric field-driven efficient charge injection and transport in organic material-based resistive memories, Applied Materials Today, 2020, pp. 1-8, vol. 20—Issue No. 100746, Elsevier.
Gang Niu et al., Geometric conductive filament confinement by nanotips for resistive switching of HfO2-RRAM devices with high performance, Scientific Reports, 2016, pp. 1-9, vol. 6—Issue No. 25757, Nature Research.
Muxi Yu et al., Novel Vertical 3D Structure of TaOx-based RRAM with Self-localized Switching Region by Sidewall Electrode Oxidation, Scientific Reports, 2016, pp. 1-10, vol. 6—Issue No. 21020, Nature Research.
Yung-Wen Chin et al., Point twin-bit RRAM in 3D interweaved cross-point array by Cu BEOL process, 2014 IEEE International Electron Devices Meeting, 2014, pp. 6.4.1-6.4.4, IEEE.
U.S. Appl. No. 17/172,085, Loy et al.

*Primary Examiner* — Marvin Payen
(74) *Attorney, Agent, or Firm* — David Cain (57) ABSTRACT

The disclosed subject matter relates generally to structures, memory devices and a method of forming the same. More particularly, the present disclosure relates to resistive random-access (ReRAM) memory devices with an electrode having tapered sides. The present disclosure provides a memory device including a first electrode having a tapered shape and including a tapered side, a top surface, and a bottom surface, in which the bottom surface has a larger surface area than the top surface, a resistive layer on and conforming to at least the tapered side of the first electrode, and a second electrode laterally adjacent to the tapered side of the first electrode, the second electrode including a top surface and a side surface abutting the resistive layer, in which the side surface forms an acute angle with the top surface.

20 Claims, 12 Drawing Sheets

MEMORY DEVICES HAVING AN ELECTRODE WITH TAPERED SIDES

FIELD OF THE INVENTION

The disclosed subject matter relates generally to structures, memory devices and a method of forming the same. More particularly, the present disclosure relates to resistive random-access (ReRAM) memory devices with an electrode having tapered sides.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to its ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high resistance state (HRS), which may be representative of an off or '0' state; and a low resistance state (LRS), which may be representative of an on or '1' state. However, these devices may experience large variations in resistive switching characteristics and may cause large fluctuations of current flow within the device, which decreases the performance of the device and increases its power consumption.

SUMMARY

In an aspect of the present disclosure, there is provided a memory device including a first electrode having a tapered shape and including a tapered side, a top surface and a bottom surface, in which the bottom surface has a larger surface area than the top surface, a resistive layer on and conforming to at least the tapered side of the first electrode, and a second electrode laterally adjacent to the tapered side of the first electrode, the second electrode including a top surface and a side surface abutting the resistive layer, in which the side surface forms an acute angle with the top surface.

In another aspect of the present disclosure, there is provided a memory device including a first electrode having a tapered shape and including a first tapered side, a second tapered side, a top surface, and a bottom surface, in which the first and second tapered sides taper towards each other as they meet the top surface, and the bottom surface has a larger surface area than the top surface, a resistive layer on and conforming to at least the first and second tapered sides of the first electrode, a second electrode laterally adjacent to the first tapered side of the first electrode, the second electrode having a top surface and at least one side surface that abuts the resistive layer, in which the side surface forms an acute angle with the top surface, and a third electrode laterally adjacent to the second tapered side of the first electrode, the third electrode having a top surface and at least one side surface that abuts the resistive layer, in which the side surface forms an acute angle with the top surface.

In yet another aspect of the present disclosure, there is provided a memory device including a first electrode having a tapered shape and including at least one tapered side, a top surface and a bottom surface, in which the bottom surface has a larger surface area than the top surface, a first resistive layer on and conforming to at least the tapered side of the first electrode, a second electrode having a tapered shape and including at least one tapered side, a top surface and a bottom surface, in which the bottom surface has a larger surface area than the top surface, a second resistive layer on and conforming to at least the tapered side of the second electrode, and a third electrode laterally between the first electrode and the second electrode, the third electrode including a top surface, a first side surface that abuts the first resistive layer, and a second side surface that abuts the second resistive layer, in which the first side surface and the second side surface of the third electrode form acute angles with the top surface of the third electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
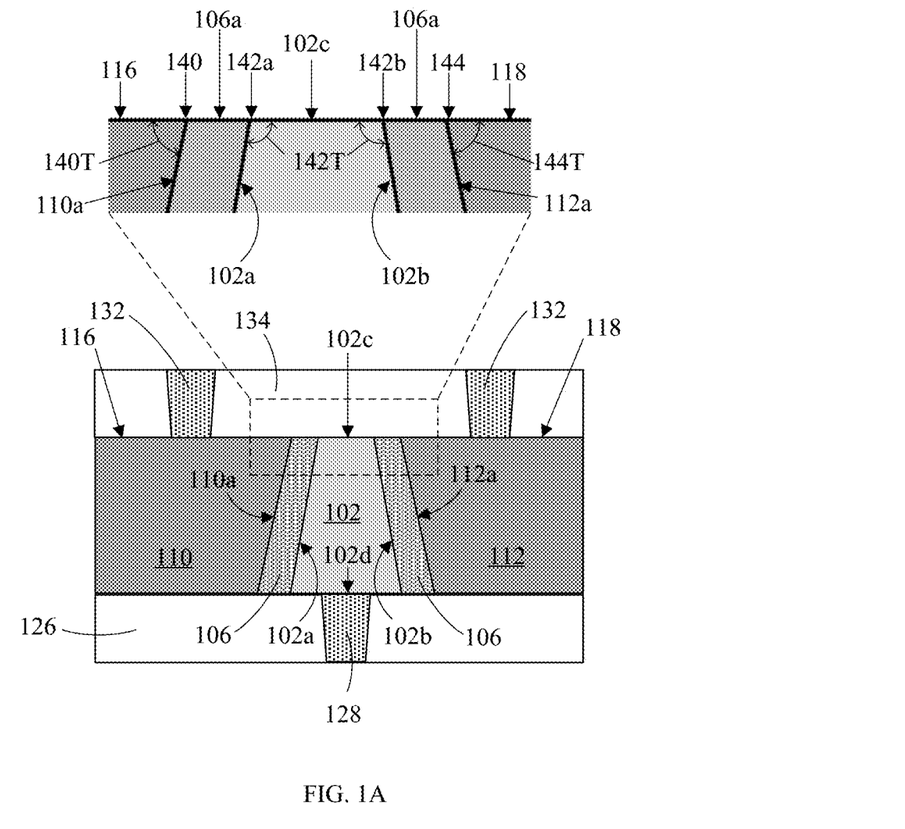
FIG. 1A and FIG. 1B are cross-sectional views of exemplary structures for use in memory devices.

Referring to FIG. 1A, a structure for use in a memory device includes a first electrode 102, a second electrode 110, and a resistive layer 106. The first electrode 102 is positioned laterally adjacent to the second electrode 110, while the resistive layer 106 is positioned laterally between the first electrode 102 and the second electrode 110. The first electrode 102 has a tapered shape with a top surface 102c and a bottom surface 102d. The bottom surface 102d has a larger surface area than the top surface 102c. The first electrode 102 may also have at least one tapered side (e.g., a first tapered side 102a and a second tapered side 102b). For example, the tapered sides 102a, 102b taper towards each other as they meet the top surface 102c. The tapered sides 102a, 102b of the first electrode 102 may form obtuse angles 142T with respect to the top surface 102c. The obtuse angle 142T may have a value between 91 degrees to 179 degrees, and preferably, between 120 degrees to 150 degrees. The tapered sides 102a, 102b may also meet the top surface 102c to provide top edges 142a, 142b (i.e., first electrode top edges).

The resistive layer 106 is disposed on and conforms to the tapered sides 102a, 102b of the first electrode 102. The resistive layer 106 may have an upper surface 106a that is substantially coplanar with the top surface 102c of the first electrode 102. Additionally, the first electrode 102 may have a substantially planar top surface 102c that is uncovered by the resistive layer 106. Examples of the material for the resistive layer 106 may include, but are not limited to, carbon polymers, perovskites, silicon dioxide, metal oxides, or nitrides. Some examples of metal oxides may include lanthanide oxides, tungsten oxide, copper oxide, cobalt oxide, silver oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. The resistive layer 106 may have a thickness that is engineered such that a relatively low voltage level may be sufficient to switch the resistance states of the resistive layer 106. Preferably, the resistive layer 106 may have a thickness in the range of about 2 nm to about 10 nm.

The second electrode 110 is laterally adjacent to the first tapered side 102a of the first electrode 102. The second electrode 110 has a top surface 116 and a side surface 110a that abuts the resistive layer 106 to form an acute angle 140T with respect to the top surface 116. In some embodiments, the top surface 116 of the second electrode 110 may have a substantially planar profile, and may also be substantially coplanar with the top surface 102c of the first electrode 102. Alternatively, the top surface 116 of the second electrode 110 may preferably have a concave profile.

The side surface 110a that abuts the resistive layer 106 may meet the top surface 116 of the second electrode 110 to provide a top edge 140 (i.e., a second electrode top edge). This side surface 110a may also have a surface profile that matches a surface profile of the tapered side 102a of the first electrode 102. The acute angle 140T between the top surface 116 and the side surface 110a may have a value between 1 degree to 89 degrees, and preferably, between 30 degrees to 60 degrees to render a sharp second electrode top edge 140.

The first electrode 102 may be structured as an active electrode while the second electrode 110 may be structured as an inert electrode. The active electrode (e.g., electrode 102) may have a thickness in the range of about 5 nm to about 10 nm. The inert electrode (e.g., electrode 110) may have a thickness in the range of about 5 nm to about 30 nm. The term "thickness" when used to characterize a thickness of an electrode described herein may be measured as a distance between a top surface of the electrode and a bottom surface of the electrode.

As used herein, the term "active electrode" may refer to an electrode having a conductive material that is capable of being oxidized and/or reduced (i.e., redox reactions) to generate electric charges for a formation of a conductive path in the resistive layer 106. Examples of the conductive material in the active electrode may include a metal such as, but not limited to, tantalum (Ta), hafnium (Hf), titanium (Ti), copper (Cu), silver (Ag), cobalt (Co), tungsten (W), or an alloy thereof. Conversely, the term "inert electrode" may refer to a conductive material that is capable of resisting redox reactions. Examples of the conductive material for the inert electrode may include, but not limited to, ruthenium (Ru), platinum (Pt), titanium nitride (TiN), tantalum nitride (TaN). In some embodiments, the resistive layer 106 may preferably include an oxide of a metal in the active electrode. For example, the resistive layer 106 may preferably include an oxide of tantalum (Ta), hafnium (Hf), titanium (Ti), copper (Cu), silver (Ag), cobalt (Co), or tungsten (W).

As shown in FIG. 1A, the structure for use in a memory device may further include a third electrode 112 positioned laterally adjacent to the second tapered side 102b of the first electrode 102, in which the resistive layer 106 may be positioned laterally between the first electrode 102 and the third electrode 110. The third electrode 112 has a top surface 118 and at least one side surface 112a that abuts the resistive layer 106 to form an acute angle 144T with respect to the top surface 118. The side surface 112a that abuts the resistive layer 106 may meet the top surface 118 of the third electrode 112 to provide a top edge 144 (i.e., a third electrode top edge). This side surface 112a may also have a surface profile that matches a surface profile of the second tapered side 102b of the first electrode 102. The acute angle 144T may have a value between 1 degree to 89 degrees, and preferably, between 30 degrees to 60 degrees to render a sharp third electrode top edge 144.

In some embodiments, the top surface 118 of the third electrode 112 may have a substantially planar profile, and may also be substantially coplanar with the top surface 102c of the first electrode 102. Alternatively, the top surface 118 of the third electrode 112 may preferably have a concave profile. The third electrode 112 may be structured as an inert electrode having a thickness in the range of about 5 nm to about 30 nm.

The first electrode 102, the second electrode 110, and the third electrode 112 may be connected to various interconnect structures to send or receive electrical signals between other circuitry and/or active components in a memory device. For example, the bottom surface 102d of the first electrode 102 may be disposed upon an interconnect via 128. Interconnect vias 132 may be disposed upon the top surface 116 of the second electrode 110 and the top surface 118 of the third electrode 112. The interconnect vias 128, 132 may include a metal such as copper, cobalt, aluminum, or an alloy thereof. The interconnect via 128 may be formed in a first inter-metal dielectric region 126 while the interconnect vias 132 may be formed in a second inter-metal dielectric region 134. Examples of dielectric material in the first inter-metal dielectric region 126 and the second inter-metal dielectric region 134 may include, but are not limited to, silicon dioxide, tetraethyl orthosilicate (TEOS), or a material having a chemical composition of $SiC_xO_yH_z$, wherein x, y, and z are in stoichiometric ratio.

Examples of the active components (not shown) that may be connected to the electrodes 102, 110, 112 may include diodes (e.g., a bi-directional diode, a single-photon avalanche diode, etc.) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

The resistive layer 106 may be configured to have a switchable resistance in response to a change in an electric signal. In particular, the resistive layer 106 may include a conductive path configured to form between the second electrode top edge 140 and the first electrode top edge 142a, and between the third electrode top edge 144 and the first electrode top edge 142b, in response to a change in the electric signal. The presence of the conductive path may reduce the resistance of the resistive layer 106 while the absence of the conductive path may increase the resistance of the resistive layer 106, thereby enabling a controllable resistive nature of the resistive layer 106. The resistive layer 106 may exhibit resistive changing properties characterized by different resistance states of the material forming this layer. These resistance states (e.g., a high resistance state (HRS) or a low resistance state (LRS)) may be used to represent one or more bits of information.

The creation of an acute angle 140T between the top surface 116 of the second electrode 110 and the side surface 110a of the second electrode 110, and the creation of an acute angle 144T between the top surface 118 of the third electrode 112 and the side surface 112a that of the third electrode 112 may provide a sharp second electrode top edge 140 and a sharp third electrode top edge 144 where a strong localization of electric fields (i.e., the largest concentration of electric charges) can be found. With a strong localization of electric fields, the conductive paths formed between the first electrode 102 and the second electrode 110 as well as between the first electrode 102 and the third electrode 112 can be confined, and do not form randomly along the length of the resistive layer 106. The confinement of the conducting path may help to reduce the stochasticity of its formation, which in turn reduces the cycle-to-cycle and device-to-device variability of the memory devices in the high resistive state. In other words, the variability of the resistance of the resistive layer 106 in the high resistive state may be reduced. This may enable a stable switching of the resistive states in the resistive layer 106 during the operation of the device and may reduce its overall power consumption.

Figure 1B:
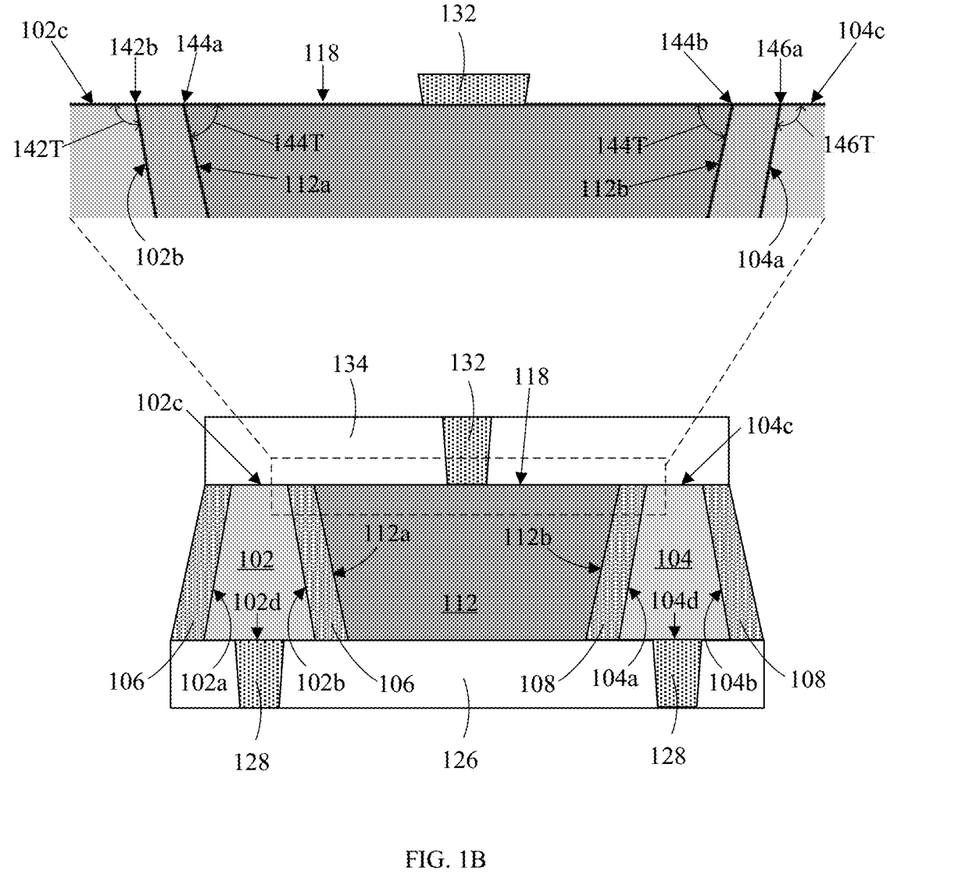

Referring to FIG. 1B, another example of a structure for use in a memory device is shown. The structure may include a first electrode 102, a second electrode 104, and a third electrode 112. The first electrode 102 has a tapered shape and includes at least one tapered side 102a, 102b, a top surface 102c, and a bottom surface 102d with a larger surface area than the top surface 102c. For example, the first electrode may have tapered sides 102a, 102b that taper towards each other as they meet the top surface 102c. The tapered side 102b may meet the top surface 102c to provide a top edge 142b (i.e., a first electrode top edge) and form an obtuse angle 142T with respect to the top surface 102c. The obtuse angle 142T may have a value between 91 degrees to 179 degrees, and preferably, between 120 degrees to 150 degrees. A first resistive layer 106 is disposed on and conforms to the tapered sides 102a, 102b of the first electrode 102.

The second electrode 104 has a tapered shape and includes at least one tapered side 104a, 104b, a top surface 104c, and a bottom surface 104d with a larger surface area than the top surface 104c. For example, the second electrode 104 may have tapered sides 104a, 104b that taper towards each other as they meet the top surface 104c. The tapered side 104a may meet the top surface 104c to provide a top edge 146a (i.e., a second electrode top edge) and form an obtuse angle 146T with respect to the top surface 104c. The obtuse angle 146T may have a value between 91 degrees to 179 degrees, and preferably, between 120 degrees to 150 degrees. A second resistive layer 108 is disposed on and conforms to the tapered sides 104a, 104b of the second electrode 104.

The third electrode 112 is positioned laterally between the first electrode 102 and the second electrode 104. The third electrode 112 has a top surface 118, a first side surface 112a that abuts the first resistive layer 106, and a second side surface 112b that abuts the second resistive layer 108. The first side surface 112a of the third electrode 112 and the second side surface 112b of the third electrode 112 form acute angles 144T with respect to the top surface 118 of the third electrode. The side surfaces 112a, 112b may also have surface profiles that match respective surface profiles of the tapered side 102b of the first electrode 102 and the tapered side 104a of the second electrode 104. Additionally, the first side surface 112a and the second side surface 112b meet the top surface 118 to provide top edges 144a, 144b (i.e., third electrode top edges). The acute angles 144T may have a value between 1 degree to 89 degrees, and preferably, between 30 degrees to 60 degrees to render sharp third electrode top edges 144a, 144b.

The creation of the acute angles 144T between the top surface 118 of the third electrode 112 and the side surfaces 112a, 112b of the third electrode 112 may provide sharp third electrode top edges 144a, 144b where a strong localization of electric fields (i.e., the largest concentration of electric charges) can be found. With a strong localization of electric fields, conductive paths that form between the first electrode top edge 142b and the third electrode top edge 144a as well as between the second electrode top edge 142a and the third electrode top edge 144b can be confined, and do not form randomly along the length of the respective resistive layers 106, 108.

In the example shown in FIG. 1B, the first electrode 102 and the second electrode 104 may be structured as active electrodes, while the third electrode 112 may be structured as an inert electrode. The first resistive layer 106 may preferably include an oxide of a metal in the first active electrode 102 while the second resistive layer 108 may preferably include an oxide a metal in the second active electrode 104. The resistive layers 106, 108 may have thicknesses in the range of about 2 nm to about 10 nm. The first electrode 102 and the second electrode 104 may have thicknesses in the range of about 5 nm to about 10 nm. The third electrode 112 may have a thickness in the range of about 5 nm to about 30 nm.

The top surface 102c of the first electrode 102 may be substantially coplanar with the top surface 104c of the second electrode 104. In some embodiments, the top surface 118 of the third electrode 112 may have a substantially planar profile, and may also be substantially coplanar with the top surface 102c of the first electrode 102 and the top surface 104c of the second electrode 104. Alternatively, the top surface 118 of the third electrode 112 may preferably have a concave profile. As shown in FIG. 1B, the bottom surface 102d of the first electrode 102 and the bottom surface 104d of the second electrode 104 may be disposed upon interconnect vias 128. An interconnect via 132 may be disposed upon the top surface 118 of the second electrode 112.

Figure 2A:
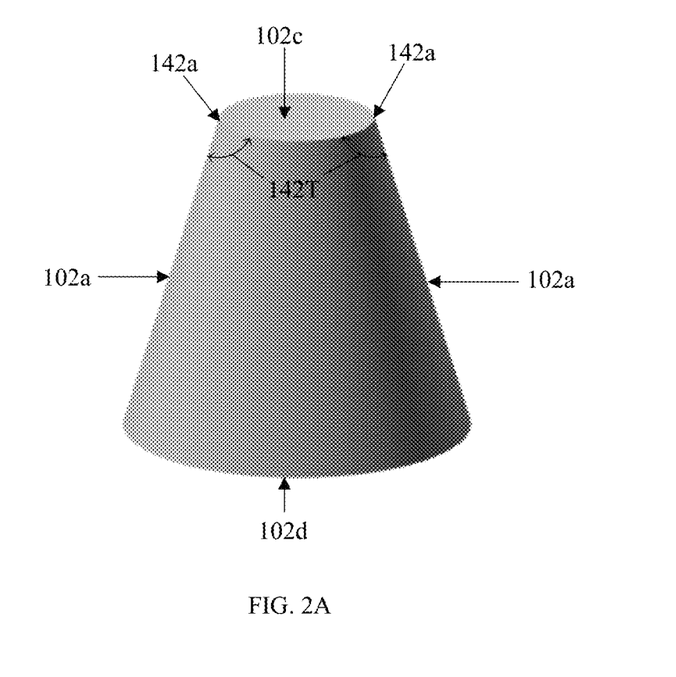
FIG. 2A, FIG. 2B, FIG. 2C are perspective views depicting examples of a first electrode in the structures shown in FIG. 1A and FIG. 1B.
Figure 2B:
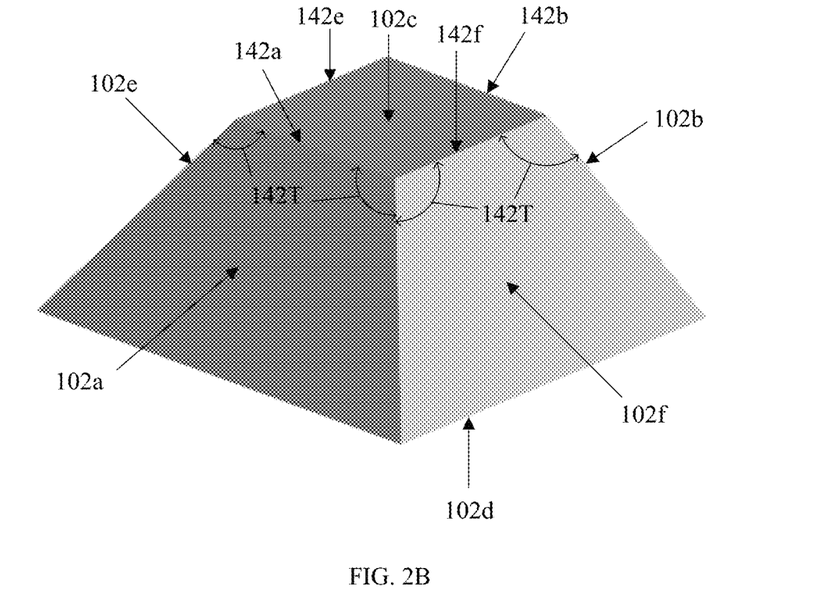
Figure 2C:
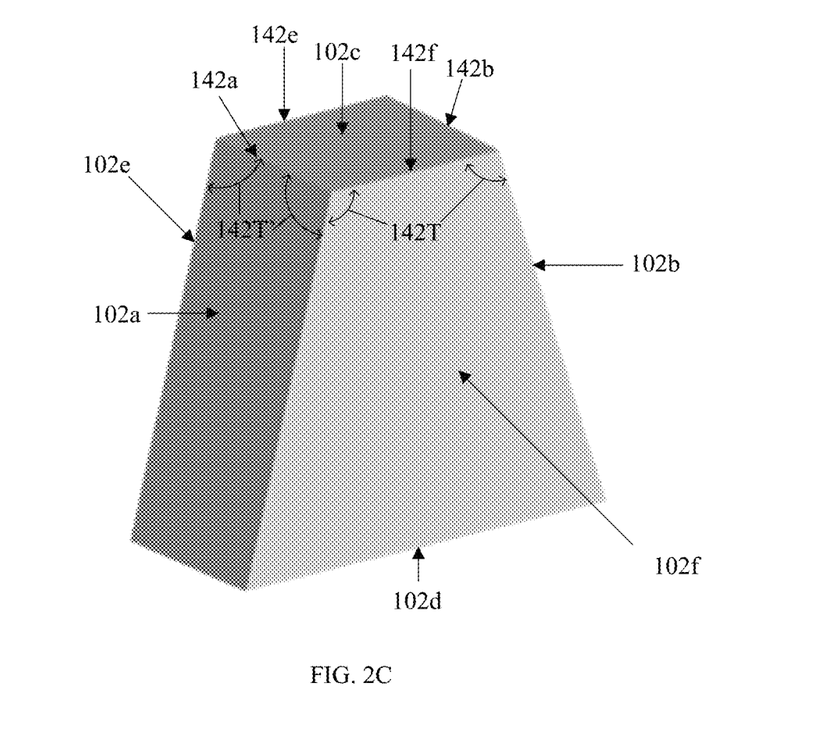

FIG. 2A, FIG. 2B, and FIG. 2C depict examples of the first electrode 102. In the representative examples, the top surface 102c of the first electrode 102 has a smaller area than the bottom surface 102d of the first electrode 102.

As shown in FIG. 2A, the first electrode 102 may have a tapered shape with a frusto-conical geometry. The first electrode 102 may have a tapered side 102a with a rounded surface profile. The tapered side 102a meets the top surface 102c to provide the top edge 142a. The top edge 142a may form an elliptical (e.g., circular or oval) perimeter around the top surface 102c. The bottom surface 102d may also have an elliptical perimeter.

As shown in FIG. 2B, the first electrode 102 may preferably have a tapered shape with a frusto-pyramidal geometry. The first electrode 102 may have a plurality of tapered sides 102a, 102b, 102e, 102f, each side having a substantially planar surface profile. The tapered sides 102a, 102b may meet the top surface 102c to provide a plurality of top edges 142a, 142b, 142e, 142f and form the obtuse angles 142T. The plurality of top edges 142a, 142b, 142e, 142f may adjoin each other to form a polygonal (e.g., pentagonal, hexagonal, heptagonal, octagonal, nonagonal, decagonal, etc.) perimeter around the top surface 102c. The bottom surface 102d may also have a polygonal perimeter.

As shown in FIG. 2C, the first electrode 102 may have at least two tapered sides 102a, 102b and vertical sides 102e, 102f that are parallel to each other. The tapered sides 102a, 102b may meet the top surface 102c to provide top edges 142a, 142b and form the obtuse angles 142T. The vertical sides 102e, 102f may meet the top surface 102c to provide top edges 142e, 142f. The vertical sides 102e, 102f may also form right angles 142T' with the top surface 102c. In an embodiment, the first electrode 102 may have a trapezoidal cross-sectional shape. Additionally, the bottom surface 102d and the top surface 102c may have polygonal (e.g, rectangular) perimeters. In another embodiment, the resistive layer 106 may be disposed on and conforming to the tapered sides 102a, 102b and the vertical sides 102e, 102f of the first electrode 102.

Figure 3A:
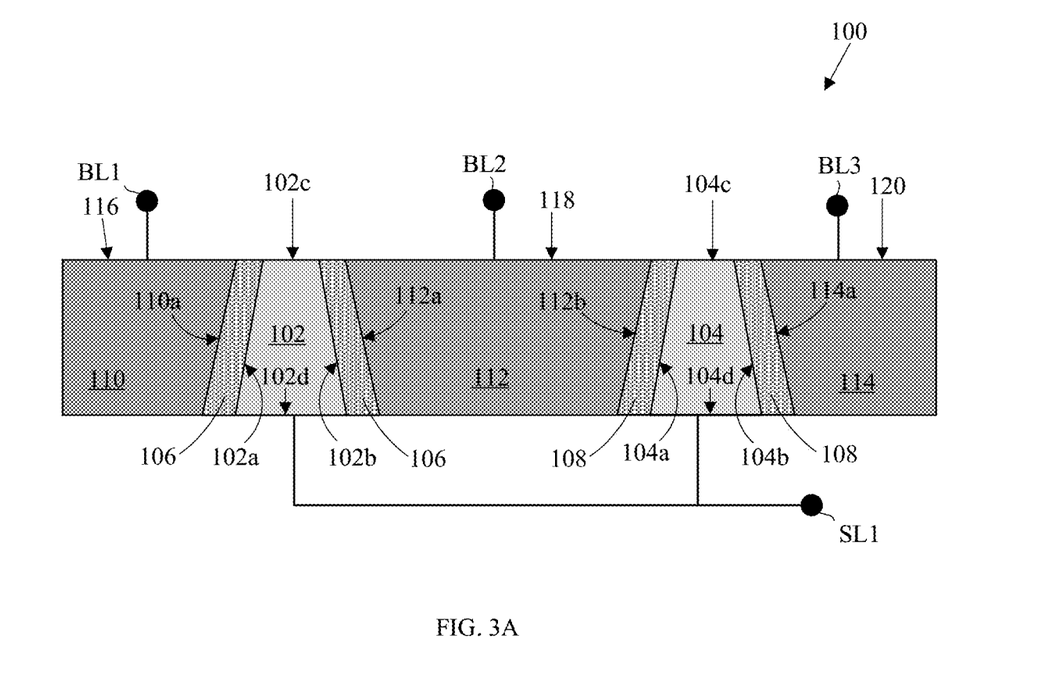
FIG. 3A is a cross-sectional view of an exemplary memory device including the structures shown in FIG. 1A and FIG. 1B.
Figure 3B:
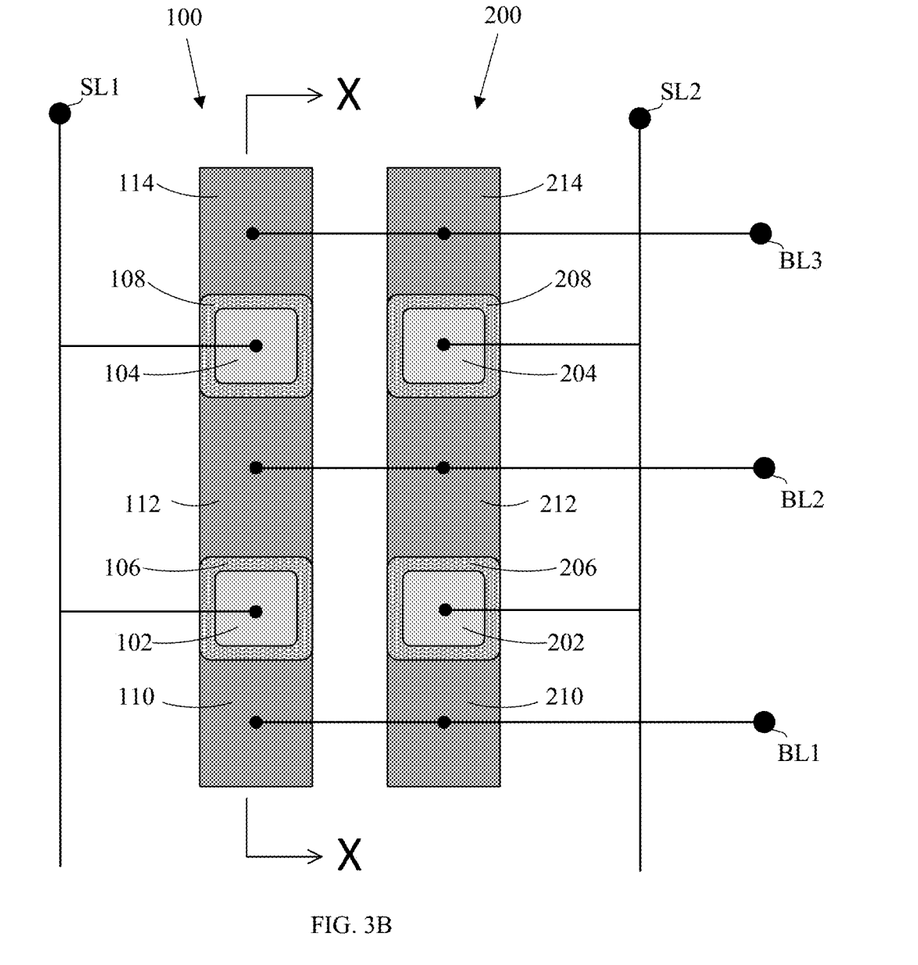
FIG. 3B is a top-down view depicting a layout of the exemplary memory device shown in FIG. 3A.

Referring to FIG. 3A and FIG. 3B, there is provided an example of a memory device having the structures shown in FIG. 1A and FIG. 1B. The cross-sectional view in FIG. 3A may be taken along the section line XX in FIG. 3B.

The memory device may include a first array 100 of active electrodes 102, 104 and inert electrodes 110, 112, 114, and a second array 200 of active electrodes 102, 104 and inert electrodes 110, 112, 114. The active electrodes 102, 104 may have respective tapered sides 102a, 102b, 104a, 104b. Resistive layers 106, 108 may be disposed on and conform to the tapered sides of the active electrodes 102, 104. Each active electrode may be positioned laterally between two inert electrodes. For example, active electrode 102 may be positioned laterally between inert electrodes 110, 112. The inert electrodes 110, 112 may have respective side surfaces 110a, 112a that abut the resistive layer 106.

As shown in FIG. 3A, the active electrodes 102, 104 may be connected to a source line SL1. Each inert electrode 110, 112, 114 may be connected to a respective bit line BL1, BL2, BL3. As shown in FIG. 3B, the active electrodes of each array may be connected to the same source line. For example, the active electrodes 102, 104 in the first array 100 may be connected to a first source line SL1, while the active electrodes 202, 204 in the second array 200 may be connected to a second source line SL2. A bit line may be connected to one of the inert electrodes in the first array and one of the inert electrodes in the second array. For example, a first bit line BL1 may be connected to the inert electrode 110 in the first array 100 and the inert electrode 210 in the second array 200. A second bit line BL2 may be connected to the inert electrode 112 in the first array 100 and the inert electrode 212 in the second array 200. A third bit line BL3 may be connected to the inert electrode 114 in the first array 100 and the inert electrode 214 in the second array 200.

Figure 4A:
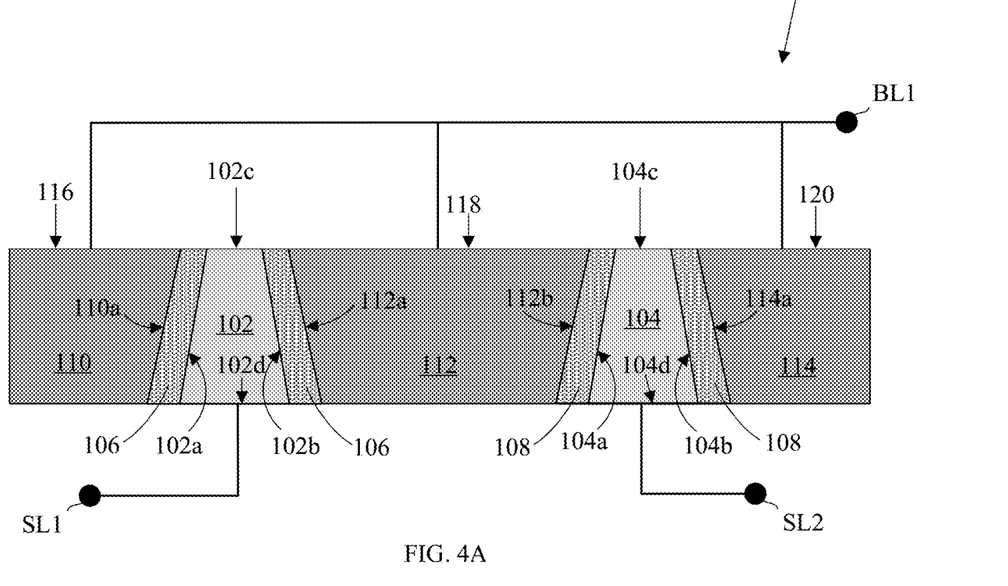
FIG. 4A is a cross-sectional view of another exemplary memory device including the structures shown in FIG. 1A and FIG. 1B.
Figure 4B:
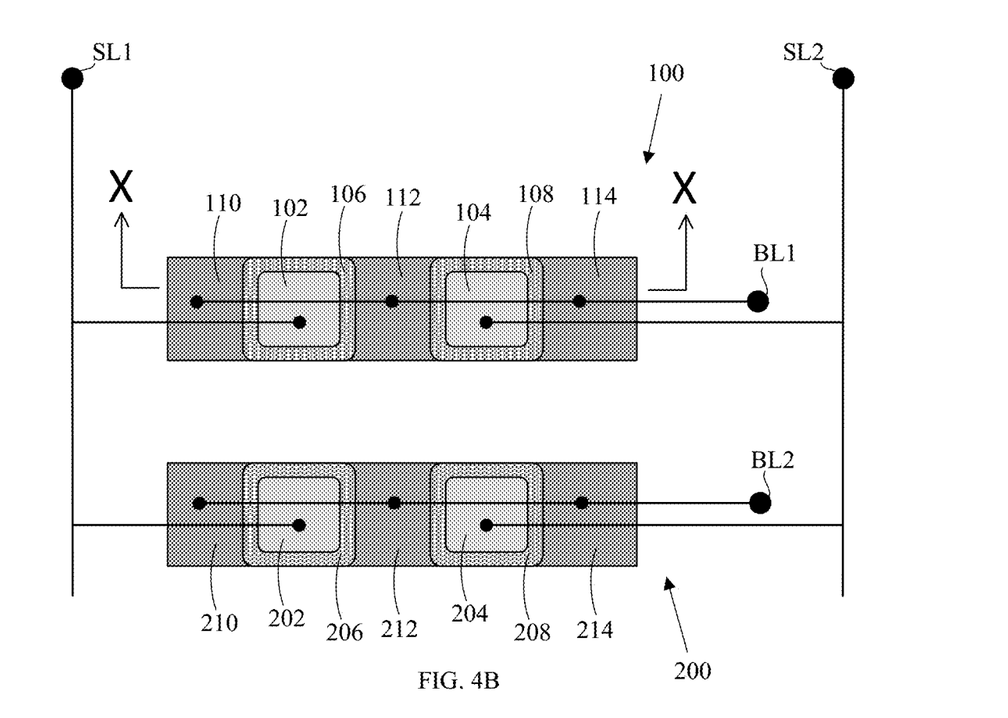
FIG. 4B is a top-down view depicting a layout of the exemplary memory device shown in FIG. 4A.

Referring to FIG. 4A and FIG. 4B, there is provided another example of a memory device having the structures shown in FIG. 1A and FIG. 1B. The cross-sectional view in FIG. 4A may be taken along the section line XX in FIG. 4B.

The memory device may include a first array 100 of active electrodes 102, 104 and inert electrodes 110, 112, 114, and a second array 200 of active electrodes 102, 104 and inert electrodes 110, 112, 114. The active electrodes 102, 104 may have respective tapered sides 102a, 102b, 104a, 104b. Resistive layers 106, 108 may be disposed on and conform to the tapered sides of the active electrodes 102, 104. Each active electrode may be positioned laterally between two inert electrodes. For example, active electrode 102 may be positioned laterally between inert electrodes 110, 112. The inert electrodes 110, 112 may have respective side surfaces 110a, 112a that abut the resistive layer 106.

As shown in FIG. 4A, each active electrode 102, 104 may be connected to a respective source line SL1, SL2. The inert electrode 110, 112, 114 may be connected to a bit line BL1. As shown in FIG. 4B, the inert electrodes of each array may be connected to the same bit line. For example, the inert electrodes 110, 112, 114 in the first array 100 may be connected to a first bit line BL1, while the inert electrodes 210, 212, 214 in the second array 200 may be connected to a second bit line BL2. A source line may be connected to one of the active electrodes in the first array and one of the active electrodes in the second array. For example, a first source line SL1 may be connected to the active electrode 102 in the first array 100 and the active electrode 202 in the second array 200. A second source line SL2 may be connected to the active electrode 104 in the first array 100 and the active electrode 204 in the second array 200.

Figure 5:
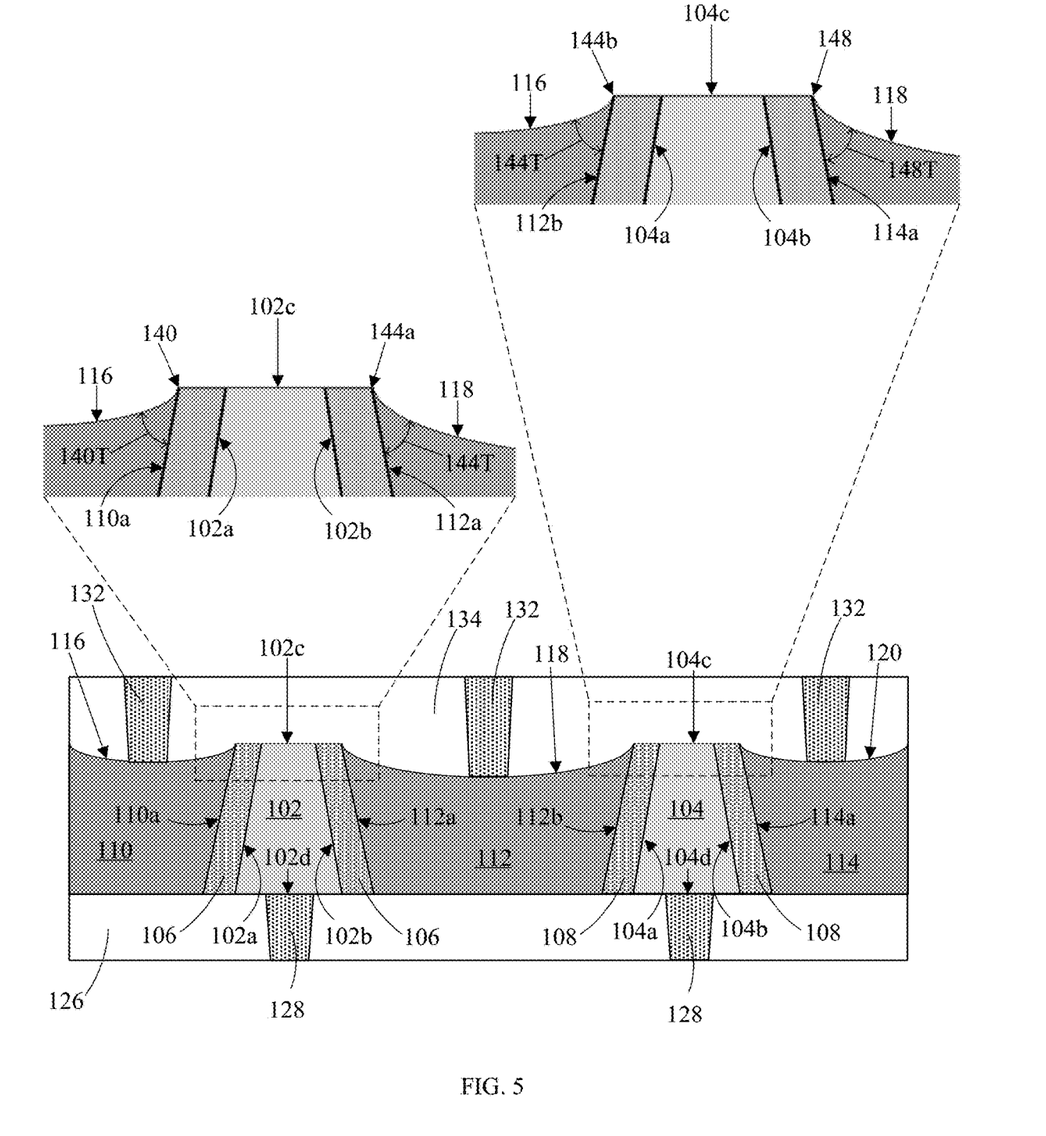
FIG. 5 is a cross-sectional view of another exemplary memory device including the structures shown in FIG. 1A and FIG. 1B.

FIG. 5 illustrates an alternative example of a memory device including the structures shown in FIG. 1A and FIG. 1B, in which like reference numerals refer to like features in FIG. 1A and FIG. 1B. As shown, the top surfaces 116, 118, 120 of electrodes 110, 112, 114 respectively may have concave profiles. The interconnect vias 128 may be formed upon the concave top surfaces 116, 118, 120.

The formation of concave profiles for the top surfaces 116, 118, 120 may provide smaller acute angles 140T, 144T, 148T between the top surfaces 116, 118, 120 and the respective side surfaces 110a, 112a, 112b, 114a as compared to the formation of substantially planar profiles for the top surfaces 116, 118, 120. The smaller acute angles 140T, 144T, 148T may facilitate greater concentrations of electric charges localized along the top edges 140, 144a, 144b, 148 and may therefore achieve better confinement of conductive paths in the resistive layers 106, 108.

The memory device described herein may be a resistive memory device. Examples of the resistive memory device may include, but are not limited to, oxide random-access memory (OxRAM) or conductive bridge random-access memory (CBRAM).

FIGS. 6, 7, 8A, 9A, and 10A show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Examples of techniques for patterning include, but not limited to, wet etch lithographic processes, dry etch lithographic processes, or direct patterning processes. Such techniques may use mask sets and mask layers.

Figure 6:
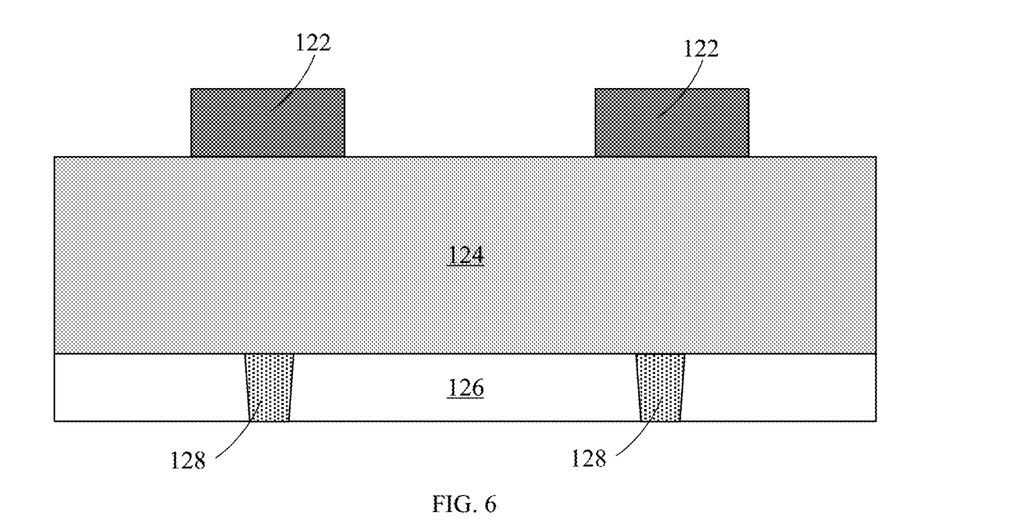
FIG. 6, FIG. 7, FIG. 8, FIG. 9A, FIG. 10A, FIG. 11A are cross-sectional views depicting a set of steps for fabricating an exemplary memory device.

Referring to FIG. 6, a first inter-metal dielectric region 126 may be formed above active components of an integrated circuit chip (e.g., in a back end of line portion). For example, the first inter-metal dielectric region 126 may be formed above a transistor. Interconnect vias 128 may be formed in the first inter-metal dielectric region 126. A first conductive material layer 124 may be formed upon the first inter-metal dielectric region 126, for example, using deposition techniques described herein. A photoresist may be deposited on the conductive material layer 124 and then patterned to define mandrel masks 122.

Figure 7:
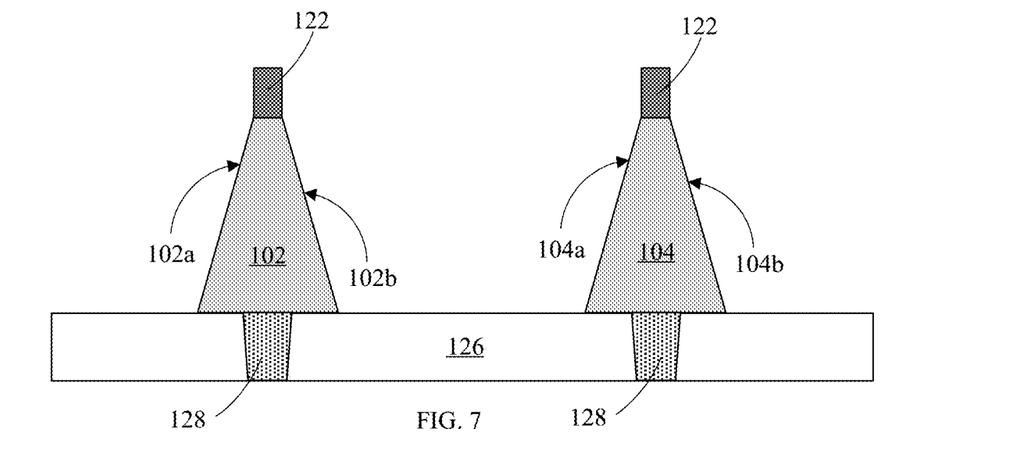
Figure 8:
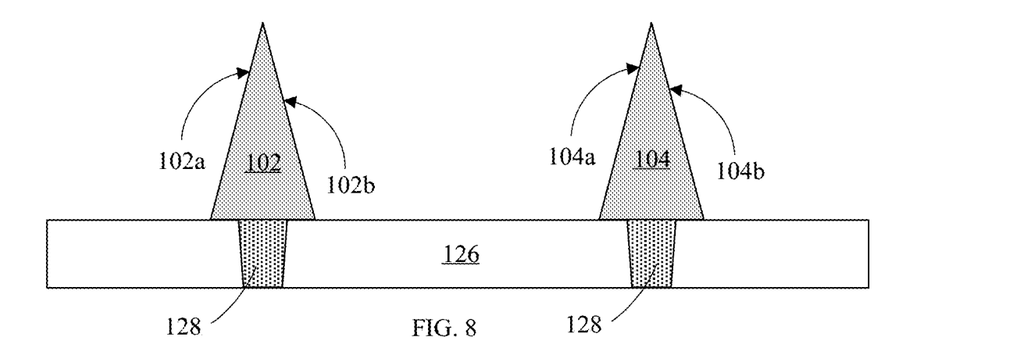

Referring to FIG. 7 and FIG. 8, the conductive material layer 124 may be patterned using the patterning techniques described herein. For example, a dry etch may be used to pattern the conductive material layer 124 and the mandrel masks 122 to form electrode 102 with tapered sides 102a, 102b and electrode 104 with tapered sides 104a, 104b. As shown in FIG. 7, the tapered sides 102a, 102b, 104a, 104b may be formed due to the erosion of the mandrel masks 122 during the etch. As shown in FIG. 8, the mandrel masks 122 may be completely eroded after the etching. Various etchants may be employed during the etching, such as oxygen ($O_2$) gas and carbon tetrafluoride ($CF_4$) gas. For example, carbon tetrafluoride may be used to etch the mandrel mask 122 while oxygen gas may be used to etch the conductive material layer 124. The patterning of the conductive material layer 124 may also expose parts of the underlying inter-metal dielectric region 126.

Figure 9A:
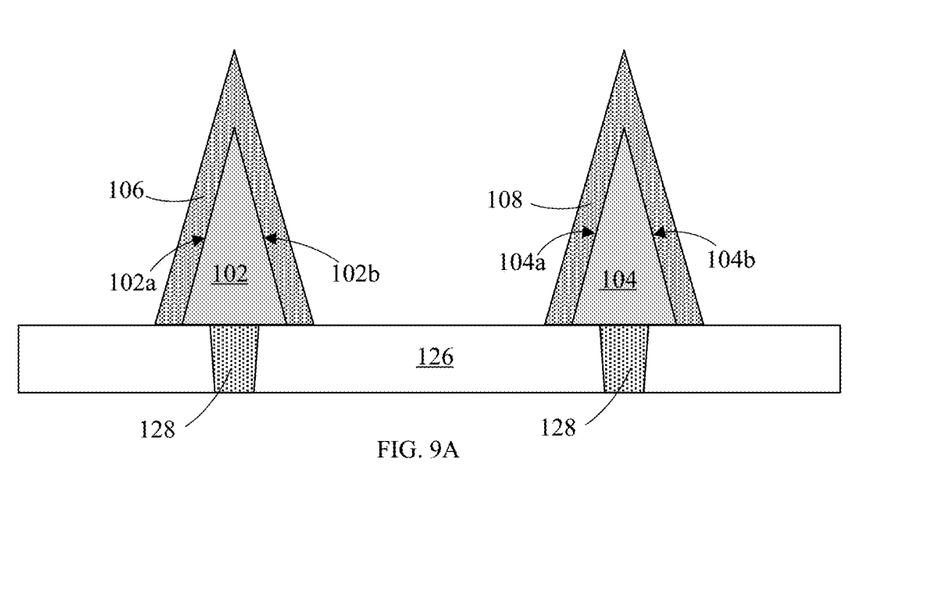

Referring to FIG. 9A (FIG. 9A continues from the structure shown in FIG. 8), a resistive layer 106 may be formed on the tapered sides 102a, 102b of the electrode 102 and a resistive layer 108 may be formed on the tapered sides 104a, 104b of the electrode 104. The resistive layers 106, 108 may be formed by oxidizing the respective tapered sides of the electrodes 102, 104. For example, the electrodes 102, 104 may be structured as active electrodes having a metal capable of being oxidized. The metal in the active electrodes 102, 104 may be oxidized by performing a heating or an annealing process in the presence of oxygen gas. The resulting resistive layers 106, 108 may conform to the respective tapered sides of the electrodes 102, 104.

Figure 10A:
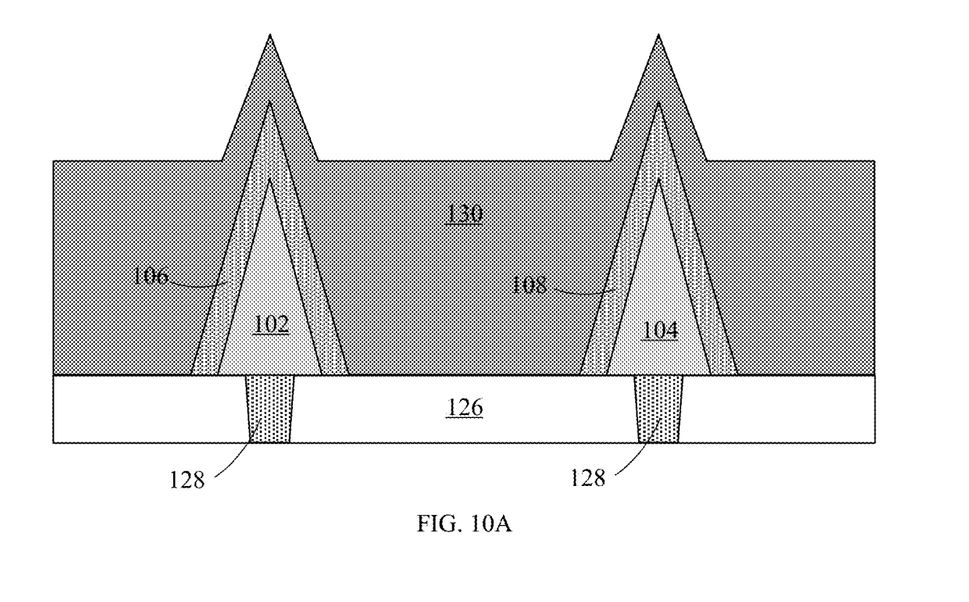

Referring to FIG. 10A (FIG. 10A continues from the structure shown in FIG. 9A), a second conductive material layer 130 may be formed on the resistive layers 106, 108 using the deposition techniques described herein. The second conductive material layer 130 may be of a different material than the first conductive material layer 124. The conductive material layer 130 may also be deposited upon the inter-metal dielectric region 126.

Figure 11A:
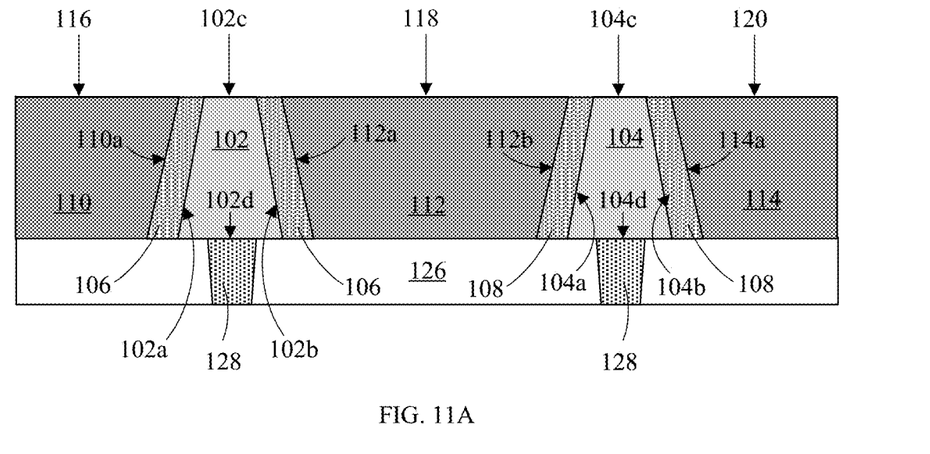

Referring to FIG. 11A (FIG. 11A continues from the structure shown in FIG. 10A), a chemical mechanical planarization (CMP) process may be performed to remove materials from the second conductive material layer 130, the resistive layers 106, 108, and the electrodes 102, 104. The CMP process may additionally form the inert electrodes 110, 112, 114 from the second conductive material layer 130. Each of the inert electrodes 110, 112, 114 may have at least one side surface (110a, 112a, 112b, 114a, respectively) that abuts the respective resistive layers 106, 108. The CMP process may further form top surfaces 102c, 104c of the electrodes 102, 104 and top surfaces 116, 118, 120 of the electrodes 110, 112, 114. The top surfaces 116, 118, 120 may have substantially planar surface profiles. Alternatively, in some embodiments, the electrodes 110, 112, 114 may have top surfaces 116, 118, 120 with concave profiles. The top surfaces 102c, 104c of the electrodes 102, 104 may be uncovered by the respective resistive layers 106, 108 after the CMP process.

Figure 9B:
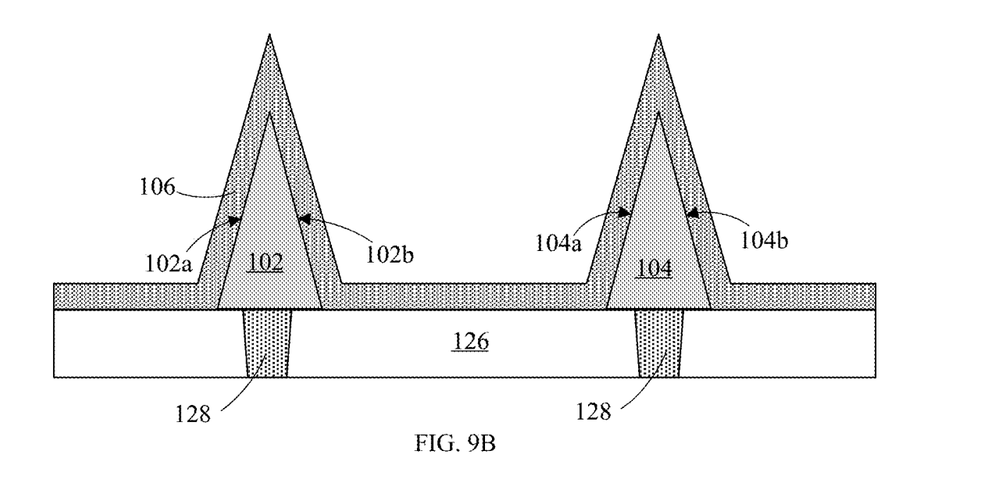
FIG. 9B, FIG. 10B, FIG. 11B are cross-sectional views depicting structures at stages subsequent to FIG. 8 of fabricating another exemplary memory device.

Referring to FIG. 9B (FIG. 9B continues from the structure shown in FIG. 8), a resistive layer 106 is formed upon the tapered sides 102a, 102b of the electrode 102 and the tapered sides 104a, 104b of the electrode 104 by using deposition techniques. For example, the resistive layer 106 may be formed using a conformal deposition process, such as an ALD process or a highly-conformal CVD process. The deposited resistive layer 106 conformally covers the electrodes 102, 104 including their tapered sides 102a, 102b, 104a, 104b, as well as the inter-metal dielectric region 126.

Figure 10B:
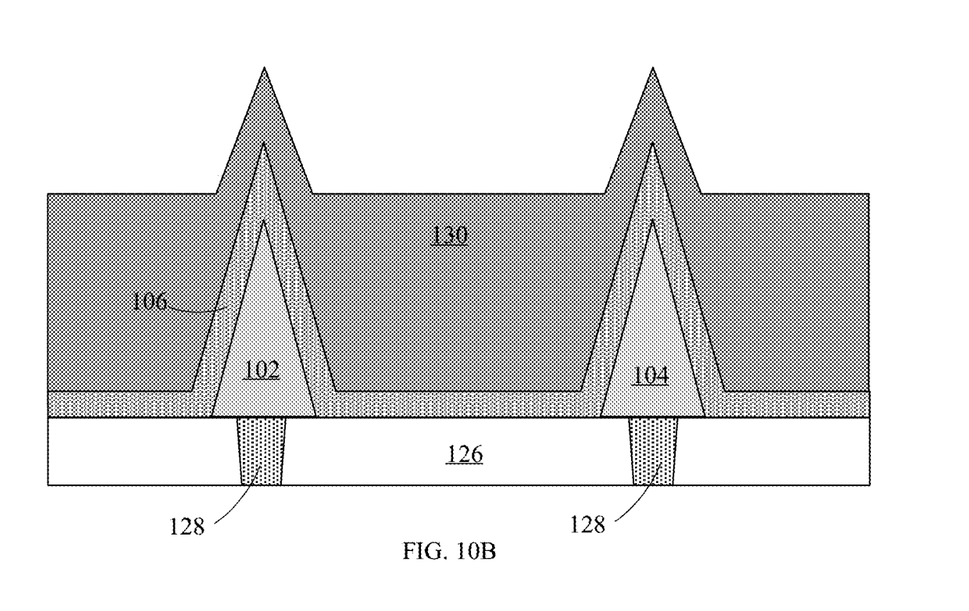

Referring to FIG. 10B (FIG. 10B continues from the structure shown in FIG. 9B), a second conductive material layer 130 may be formed on the resistive layer 106 using the deposition techniques described herein. The second conductive material layer 130 may be of a different material than the first conductive material layer 124.

Figure 11B:
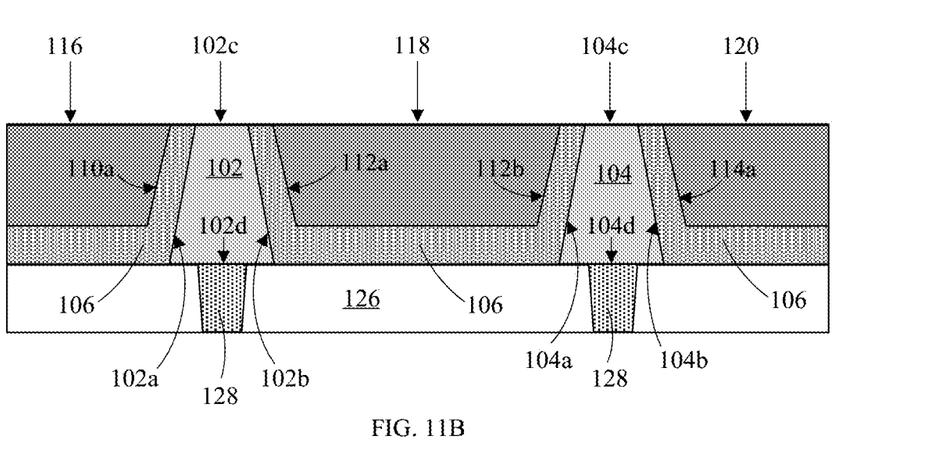

Referring to FIG. 11B (FIG. 11B continues from the structure shown in FIG. 10B), a chemical mechanical planarization (CMP) process may be performed to remove materials from the second conductive material layer 130, the resistive layer 106, and the electrodes 102, 104. The CMP process may additionally form the inert electrodes 110, 112, 114 from the second conductive material layer 130. Each of the inert electrodes 110, 112, 114 may have at least one side surface (110a, 112a, 112b, 114a, respectively) that abuts the resistive layer 106. The CMP process may further form top surfaces 102c, 104c of the electrodes 102, 104 and top surfaces 116, 118, 120 of the electrodes 110, 112, 114. The top surfaces 116, 118, 120 may have substantially planar surface profiles. Alternatively, in some embodiments, the electrodes 110, 112, 114 may have top surfaces 116, 118, 120 with concave profiles. The top surfaces 102c, 104c of the electrodes 102, 104 may be uncovered by the resistive layer 106 after the CMP process. Subsequently, the structures shown in FIG. 11A and FIG. 11B may be subjected to further processes to form interconnect vias upon the top surfaces of the electrodes 110, 112, 114.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
a first electrode having a tapered shape and comprising a tapered side, a top surface, and a bottom surface, wherein the bottom surface has a larger surface area than the top surface;
a resistive layer on and conforming to at least the tapered side of the first electrode; and
a second electrode laterally adjacent to the tapered side of the first electrode, the second electrode comprising a top surface and a side surface abutting the resistive layer, wherein the side surface forms an acute angle with the top surface.

2. The device of claim 1, wherein the side surface of the second electrode meets the top surface of the second electrode to provide a second electrode top edge.

3. The device of claim 2, wherein the tapered side of the first electrode forms an obtuse angle with respect to the top surface of the first electrode.

4. The device of claim 3, wherein the tapered side of the first electrode meets the top surface of the first electrode to provide a first electrode top edge.

5. The device of claim 4, wherein the resistive layer includes a conductive path configured to form between the second electrode top edge and the first electrode top edge in response to a change in an electric signal.

6. The device of claim 2, wherein the top surface of the second electrode has a concave profile.

7. The device of claim 6, wherein resistive layer has an upper surface that is substantially coplanar with the top surface of the first electrode.

8. The device of claim 7, wherein the top surface of the first electrode is substantially planar and uncovered by the resistive layer.

9. The device of claim 2, wherein the top surface of the second electrode is substantially coplanar with the top surface of the first electrode.

10. The device of claim 5, wherein the first electrode is structured as an active electrode, and the second electrode is structured as an inert electrode.

11. The device of claim 10, wherein the active electrode includes a metal, and the resistive layer includes an oxide of the metal in the active electrode.

12. The device of claim 1, wherein the side surface of the second electrode has a surface profile, and the surface profile of the side surface of the second electrode matches the surface profile of the tapered side of the first electrode.

13. The device of claim 12, wherein the tapered side of the first electrode has a rounded surface profile.

14. The device of claim 12, wherein the tapered side of the first electrode has a substantially planar surface profile.

15. The device of claim 4, wherein the top edge of the first electrode forms an elliptical perimeter around the top surface of the first electrode.

16. The device of claim 3, wherein the first electrode further includes a plurality of tapered sides that meet the top surface to provide a plurality of first electrode top edges.

17. The device of claim 16, wherein the plurality of first electrode top edges form a polygonal perimeter around the top surface of the first electrode.

18. A memory device comprising:
a first electrode having a tapered shape and comprising a first tapered side, a second tapered side, a top surface, and a bottom surface, wherein the first and second tapered sides taper towards each other as they meet the top surface, and the bottom surface has a larger surface area than the top surface;
a resistive layer on and conforming to at least the first and second tapered sides of the first electrode;
a second electrode laterally adjacent to the first tapered side of the first electrode, the second electrode having a top surface and at least one side surface that abuts the resistive layer, wherein the side surface forms an acute angle with the top surface; and
a third electrode laterally adjacent to the second tapered side of the first electrode, the third electrode having a top surface and at least one side surface that abuts the resistive layer, wherein the side surface forms an acute angle with the top surface.

19. The device of claim 18, wherein the top surface of the second electrode and the top surface of the third electrode have concave profiles.

20. A memory device comprising:
a first electrode having a tapered shape and comprising at least one tapered side, a top surface, and a bottom surface, wherein the bottom surface has a larger surface area than the top surface;
a first resistive layer on and conforming to at least the tapered side of the first electrode;
a second electrode having a tapered shape and comprising at least one tapered side, a top surface, and a bottom surface, wherein the bottom surface has a larger surface area than the top surface;
a second resistive layer on and conforming to at least the tapered side of the second electrode; and
a third electrode laterally between the first electrode and the second electrode, the third electrode comprising a top surface, a first side surface that abuts the first resistive layer, and a second side surface that abuts the second resistive layer, wherein the first side surface and the second side surface of the third electrode form acute angles with the top surface of the third electrode.

* * * * *